United States Patent
Kuzawinski et al.

(10) Patent No.: US 6,956,286 B2
(45) Date of Patent: Oct. 18, 2005

(54) INTEGRATED CIRCUIT PACKAGE WITH OVERLAPPING BOND FINGERS

(75) Inventors: Mark J. Kuzawinski, Maine, NY (US); Edward M. Wolf, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 10/634,414

(22) Filed: Aug. 5, 2003

(65) Prior Publication Data

US 2005/0029649 A1 Feb. 10, 2005

(51) Int. Cl.[7] .............................................. H01L 23/48
(52) U.S. Cl. ...................... 257/700; 257/701; 257/758; 257/691; 257/698; 257/696; 257/784; 257/786; 257/774; 257/680; 257/773; 257/782; 361/794; 361/777; 361/780
(58) Field of Search ................................ 257/700, 701, 257/758, 691, 698, 696, 784, 786, 774, 680, 773, 692, 693, 778, 782; 361/794, 777, 780

(56) References Cited

U.S. PATENT DOCUMENTS

| | | | |
|---|---|---|---|
| 5,723,906 A | | 3/1998 | Rush |
| 5,741,729 A | * | 4/1998 | Selna .......................... 438/125 |
| 6,137,168 A | | 10/2000 | Kirkman |
| 6,214,638 B1 | | 4/2001 | Banerjee |
| 6,359,341 B1 | * | 3/2002 | Huang et al. ................ 257/778 |
| 6,465,882 B1 | * | 10/2002 | Cohn et al. .................. 257/691 |
| 6,489,682 B1 | * | 12/2002 | Yeh et al. ..................... 257/738 |
| 6,541,854 B2 | * | 4/2003 | Huang et al. ................ 257/707 |
| 6,582,979 B2 | * | 6/2003 | Coccioli et al. ............... 438/25 |
| 6,703,698 B2 | * | 3/2004 | Huang et al. ................ 257/678 |
| 6,756,665 B1 | * | 6/2004 | Chang .......................... 257/691 |
| 6,770,963 B1 | * | 8/2004 | Wu .............................. 257/691 |
| 6,790,760 B1 | * | 9/2004 | Cohn et al. .................. 438/613 |
| 6,812,580 B1 | * | 11/2004 | Wenzel et al. ............... 257/784 |
| 2003/0179549 A1 | * | 9/2003 | Zhong et al. ................ 361/707 |
| 2004/0124545 A1 | * | 7/2004 | Wang .......................... 257/784 |

FOREIGN PATENT DOCUMENTS

JP            8-8359        *    1/1996

* cited by examiner

*Primary Examiner*—Alexander Oscar Williams
(74) *Attorney, Agent, or Firm*—Schmeiser, Olsen & Watts; William H. Steinberg

(57) ABSTRACT

An integrated circuit package comprises a set of bond fingers for connecting wire bonds from the chip, the bond fingers being placed overlapping on a transverse axis from the chip and extending inwardly and outwardly from vias positioned at different positions along the transverse axis, so that wire bonds connected to adjacent fingers have the same length.

5 Claims, 6 Drawing Sheets

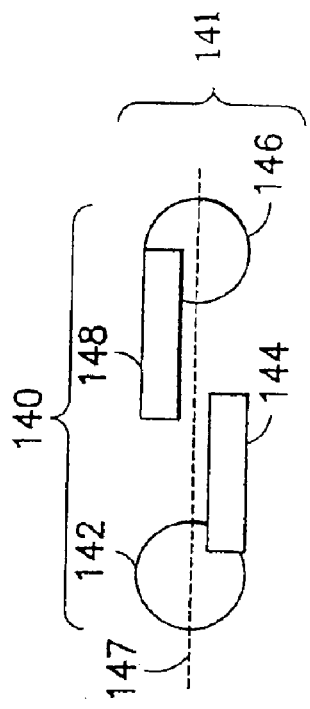
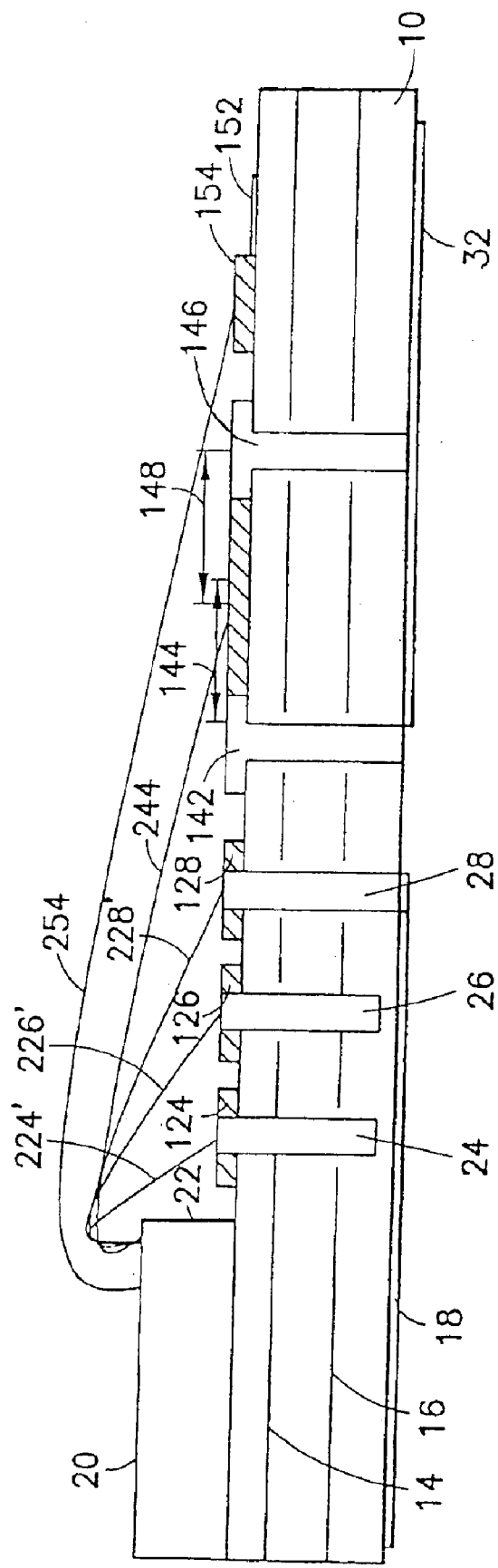
FIG.1B
FIG.1A

INTEGRATED CIRCUIT PACKAGE WITH OVERLAPPING BOND FINGERS

TECHNICAL FIELD

The field of the invention is that of packaging integrated circuits.

BACKGROUND OF THE INVENTION

In the field of packaging integrated circuits, a recurring problem has been that of increasing the density of connections to keep up with the constant shrinkage of dimensions on the integrated circuit chips.

Packaging technology has not been able to adopt the technology of ICs wholesale for a number of reasons, including cost and the difficulty of adapting the sub-microscopic dimensions of integrated circuit technology to the macroscopic environment in which packages operate.

In the particular case of wire-bond technology, the mechanical requirements of the wire-bond machines set requirements of strength and thus of dimension on the wires. The dimensional requirements on the wires impose corresponding requirements on the bond pads to which the wires are bonded.

On solution that has been used in the art is to place one or more continuous rings close in to the circuit to carry the DC power (ground, Vdd, etc.) all around the circuit so that it can be tapped into at any location. Since the rings are continuous, placement accuracy for a bond is not a concern. These rings are connected by one or more vias to wide (and therefore low-inductance) conductors positioned at lower levels in a multi-level package.

Signal connections are made further out from the chip along a set of transverse axes extending perpendicular to the chip edges. Commonly, the pitch of contacts is increased as the distance out from the chip increases, so that more space is available to provide for greater tolerance in making wire-bond connections and to route signal lines between the bond pads.

Those skilled in the art understand that, other things being equal, it is preferable if the pitch of the package bond pads matches the pitch on the chip bond pads. Since the package bond pads need to be wider, that means various schemes to pack more than one package bond pad in the space taken by a chip bond pad.

U.S. Pat. No. 6,214,638 shows a multi-tier package in which the die is located at the bottom of a set of tiers of package bond pads. The bond pads are arranged so that the pads in the outermost row overlap the die pads in an adjacent group. This arrangement inherently causes the bond wires to be non-perpendicular to the chip. It also suffers from increased inductance due to relatively long bond wires.

U.S. Pat. No. 5,723,906 also shows a multi-tier package in which the die is located at the bottom of a set of tiers of package bond pads. In this case, the bottom level contains several integrated circuits that are connected to one another by wire bonds. This arrangement inherently causes the bond wires to be non-perpendicular to the chip. It also suffers from increased inductance due to relatively long bond wires.

U.S. Pat. No. 6,137,168 shows an arrangement in which the wires have large angles from the perpendicular. as well as routing signal lines underneath the die.

SUMMARY OF THE INVENTION

The invention relates to a package for integrated circuits that has a set of bond pads that track the pitch of the pads on the chip.

One aspect of the invention is the arrangement of the package bond pads in bond pad modules, each of which contains a pair of bond pads that overlap along a transverse axis extending perpendicular to a side of the chip, one of the pads being connected to a via that is located inward of the overlap area and the other one being connected to a via that is located outward of the overlap area, so that a pair of wire bonds attached in the overlap area will both have the same length and therefore the same inductance.

Another aspect of the invention is that the overlap areas permit a set of bond pads to take up less distance along the transverse axis, so that more pads can be placed within a bond pad module.

Another aspect of the invention is that the bond pad modules can contain as many package bond pads in a given length parallel to a side of the chip as there are on the chip, so that the wires for wire bonds extend perpendicular to the chip.

BRIEF DESCRIPTION OF THE DRAWINGS

FIG. 1A shows a cross section of a first embodiment of the invention.

FIG. 1B shows a top view of a portion of the cross section of FIG. 1A.

DETAILED DESCRIPTION

Figure 2:
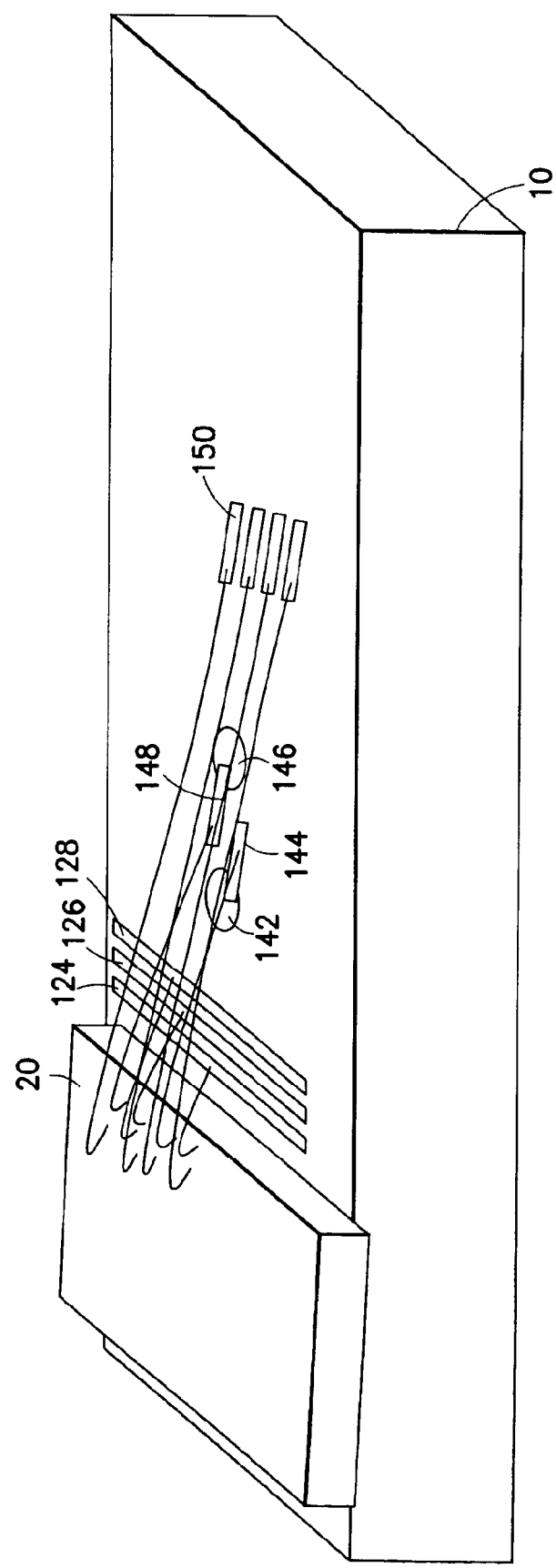
FIG. 2 shows a perspective view of the embodiment of FIG. 1.

FIG. 1A shows a cross section of an embodiment of the invention, in which substrate 10 is the base layer of a package. Substrate 10 contains power planes 14, 16 and 18 embedded in it or on the bottom surface to carry ground, Vdd and another voltage level around to various places where the power can be tapped into die 20. Three power rings, 124, 126 and 128 are connected by vias 24, 26 and 28 respectively, to the power planes 14, 16 and 18, respectively. The rings are connected by bond wires 224', 226' and 228' to connections on die 20.

On the same level, vias 142 and 146 carry signals passing to and from the die and signal bond pads 144 and 148 (also referred to as bond fingers) on wire 244 and a corresponding wire behind wire 244. The vias are connected to a network of signal connectors represented schematically by heavy line 32 on the bottom of substrate 10. Signal lines could also be formed on the top surface or at an intermediate height location if space allows.

According to the invention, as shown in the top view, FIG. 1B, of vias 142 and 146 and the space between; two bond fingers 144 and 148 are attached to respective vias 142 and 146 and extend toward each other, overlapping along a transverse axis perpendicular to the side 22 of die 20 that is shown in this Figure. The extent of the package bond overlap is denoted with bracket 143 in FIG. 5, which shows various details of the package bond module. Bracket 140 in FIG. 1B denotes the extent of the via-submodule that comprises two vias positioned at substantially the same longitudinal position along the die edge, each via having one of a pair of overlapping fingers connected to it that overlap along the transverse axis. The extent of fingers 144 and 148 is shown by brackets with those numbers in FIG. 1A. With this arrangement, the pitch of a module along a longitudinal direction perpendicular to the transverse axis (and parallel to the side of die 20) denoted by bracket 141 in FIG. 1B is reduced to the amount required to hold a single via (plus the required spacing to separate vias), in contrast to the prior art. The ability to place more bond pads along the transverse axis permits the disposition of a greater number of bond pads within a given module pitch. The bond pad fingers are positioned so that they do not extend past the via in the direction parallel to the die edge, in order to keep the pitch to a minimum.

The extent of pitch 141 is set by the greater of: a) the diameter of the vias plus the required spacing between vias; or b) by the width of bond fingers 144 and 148 plus the required spacing between them and between the adjacent bond finger in the next package bond pad module, using the foregoing term to refer to a set of contacts, bond pads, etc. that is repeated as a block along the length of the die. The bond pad modules contain at least one via submodule as described above.

In current packaging technology, the vias 142, 146 are the limiting factor, as they have to be wider than the bond pads 144, 148.

Further out from the overlapping bond pad fingers, a pad 154, contacted by bond wire line 254, is shown as attached to line 152, representing schematically a set of interconnects formed on the top surface of substrate 10. It is not necessary for the practice of the invention that the bond pads be connected immediately to vias and some interconnection on the surface may also be used as well as optional interconnects on lines embedded in substrate 10.

FIG. 2 shows a simplified version of the arrangement of the preceding figures in perspective, with die 20 having connections to three power rings 126, 124 and 128 close in to the die. A second connection of wire bonds to pads 144 and 148 that are connected to vias 142 and 146 is located further out from the power rings. A third connection to bond fingers 150, as many as will fit in the pitch determined by the central via-bond finger overlapping structure, is shown to permit further connections.

Preferably, as can be seen in FIG. 2, the wires from the die pads to the package pads are substantially at a right angle to the edge of the die. Placement at an exact right angle is not required, since the individual bond pads will not line up exactly with the corresponding pads on the die. Also preferably, the package bond pads are all on the same level, which reduces inductance in the leads.

Figure 3B:
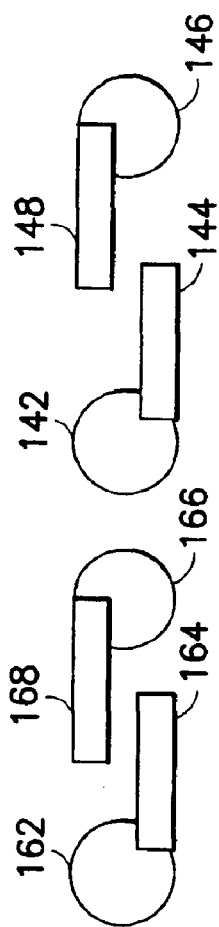
FIG. 3B shows a top view of a portion of the cross section of FIG. 3A.
Figure 3A:
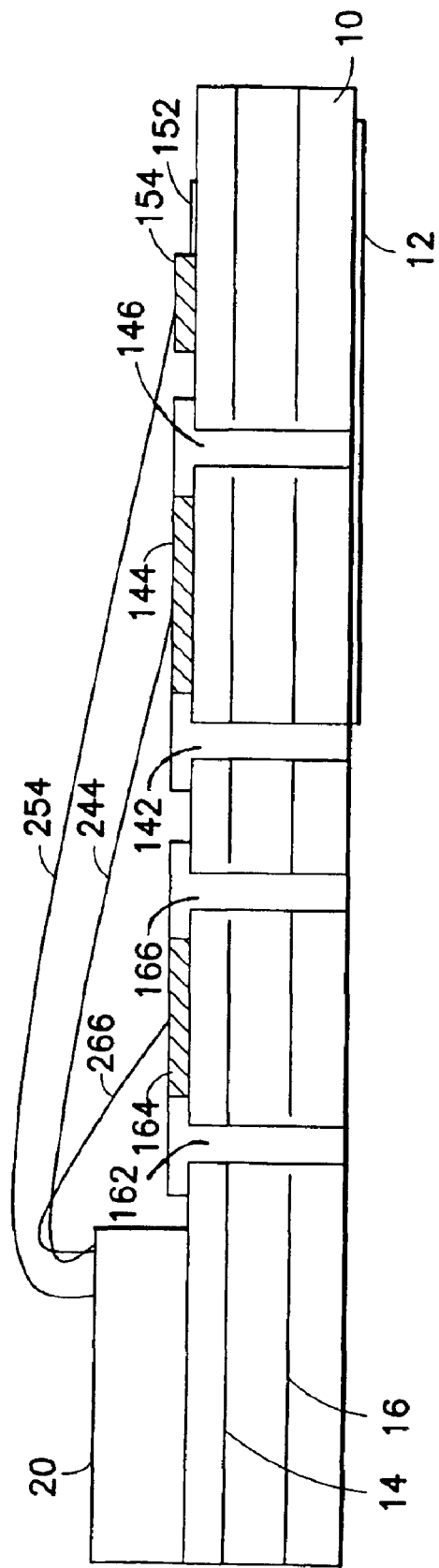
FIG. 3A shows a cross section of a second embodiment of the invention.

FIG. 3A shows a similar cross section, in which the power rings have been replaced by a set of vias 162 and 166 with bond finger 164 being contacted by wire 266. It should be noted that, in this cross section, only one wire is shown contacting bond finger 166—other wires are behind or before the plane of the paper and make contact to the bond finger connected to via 166 and to corresponding fingers in other modules. FIG. 3B shows a top view of vias 162 and 166 with corresponding bond fingers 164 and 168. Another advantageous feature of the invention is that the leads to the fingers are now approximately the same length, since the bond location can now be the same length from the die for two values of the DC power distribution. It is customary, but not required, that the bond pads for DC power be located closest to the die.

Yet another aspect of the invention is that a particular transverse location is not reserved for a single DC power level or even for two. If desired, the system designer could interleave three or more power levels on bond fingers located at the same distance from die 20 by appropriately connecting the vias. In this case, no connection for DC power passes through substantially all of the modules on an edge of the die, but each DC connection passes through a smaller number of modules. As an alternative, two levels of DC power could pass into the same package bond module, or into adjacent modules. Thus, if desired, all power levels could be set to have the same inductance by connecting them with wires having the same length.

In the remainder of FIG. 3A, a second set of via-submodules with vias 142 and 146 and fingers 144 and 148, respectively are the same as in FIG. 1A. Similarly, bond finger 154 and interconnect 152 are the same as in the prior Figure. FIG. 3B also shows the top view of the two via-submodules with vias 162–166 connected to fingers 164 and 168, respectively, and vias 142–146 connected to fingers 144 and 148, respectively.

Figure 4:
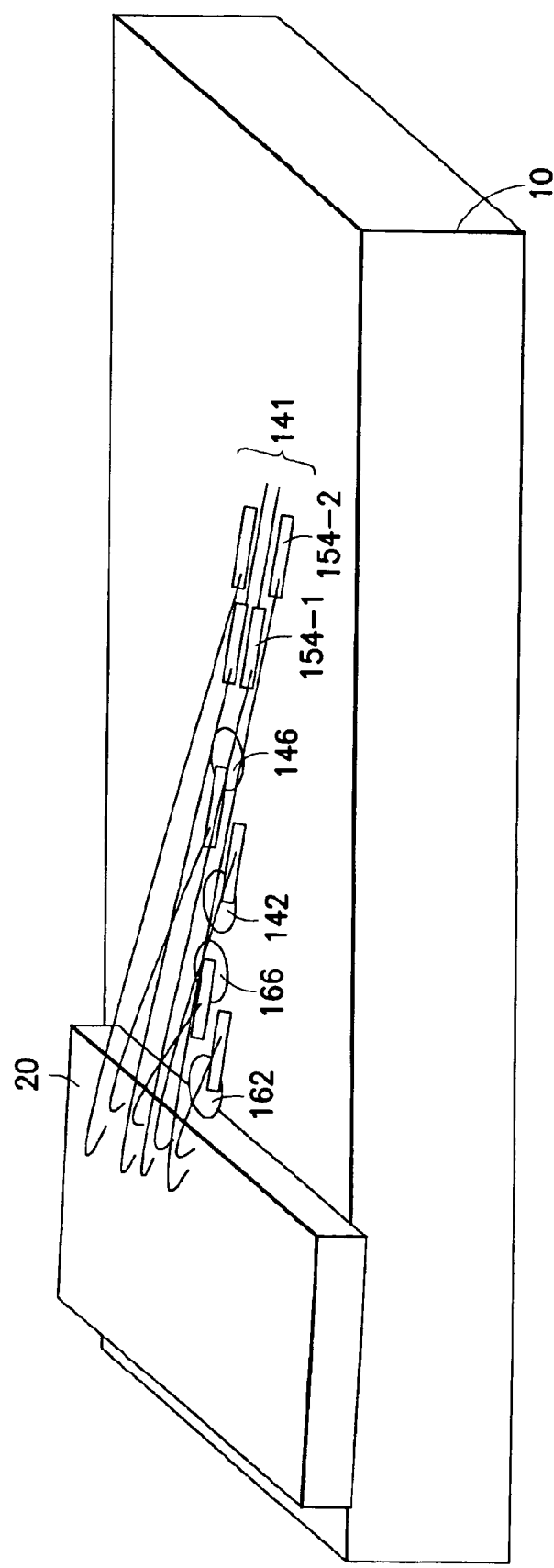
FIG. 4 shows a perspective view of the embodiment of FIG. 3.

FIG. 4 shows the arrangement of FIG. 3 in perspective, with two sets of vias 162–166 and their associated fingers and 142–146 and their associated fingers. Two sets of surface fingers 154-1 and 154-2 are shown as fitting within pitch 141 in this case.

Figure 5:
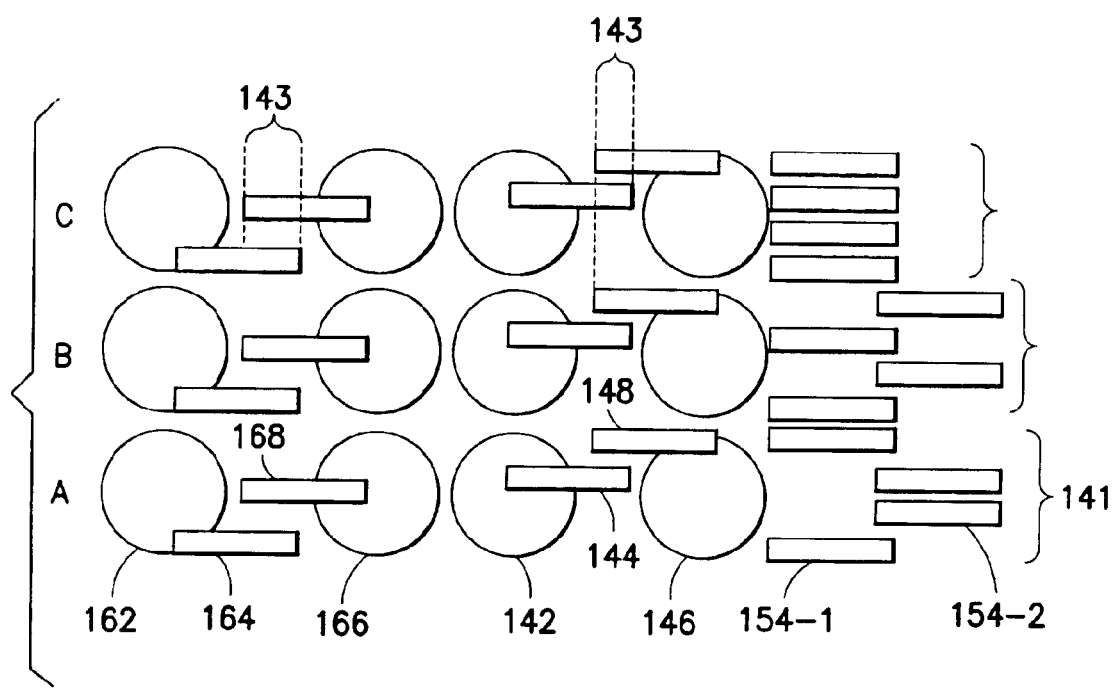
FIG. 5 shows a plan view of a set of several bond pad modules.

FIG. 5 shows a top view of an arrangement similar to FIG. 4, with some variations illustrated. In the bottom row, row A, two vias 162, 166 and associated fingers 164 and 168 and a second set of two vias 142, 146 and fingers 144 and 148 are shown, with a variation in the placement of the fingers. In this Figure, the first pair of fingers are shifted to the lower edge of the vias and the second set are shifted to the upper side of the vias. This permits better alignment with the die bond pads, which are shifting along the length of the die. The surface fingers have an "arrowhead" arrangement with the first pair, 154-1 being on the outside and the second pair 154-2 being on the inside. The second row, Row B, shows the same via-finger arrangement with the surface fingers now arranged in the same pattern—the lower two alternating in distance from the die and the upper two doing the same. The top row, Row C, shows the surface fingers all having the same distance from the die, so that the inductance for each lead will be the same. Brackets 143 indicate the package bond module overlap region of the bond fingers.

Figure 6:
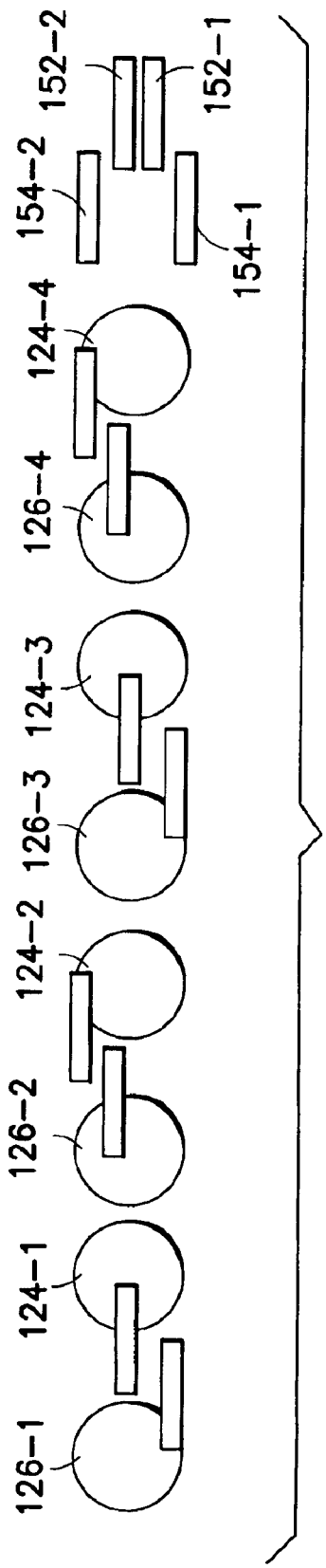
FIG. 6 shows plan view of an alternative embodiment of the invention.

FIG. 6 shows another modification, this time with four sets of vias and bond fingers (126-1 and 124-1 to 126-4 and 124-4) and a single set of surface bond fingers (154-1 and -2 and 152-1 and -2).

Figure 7:
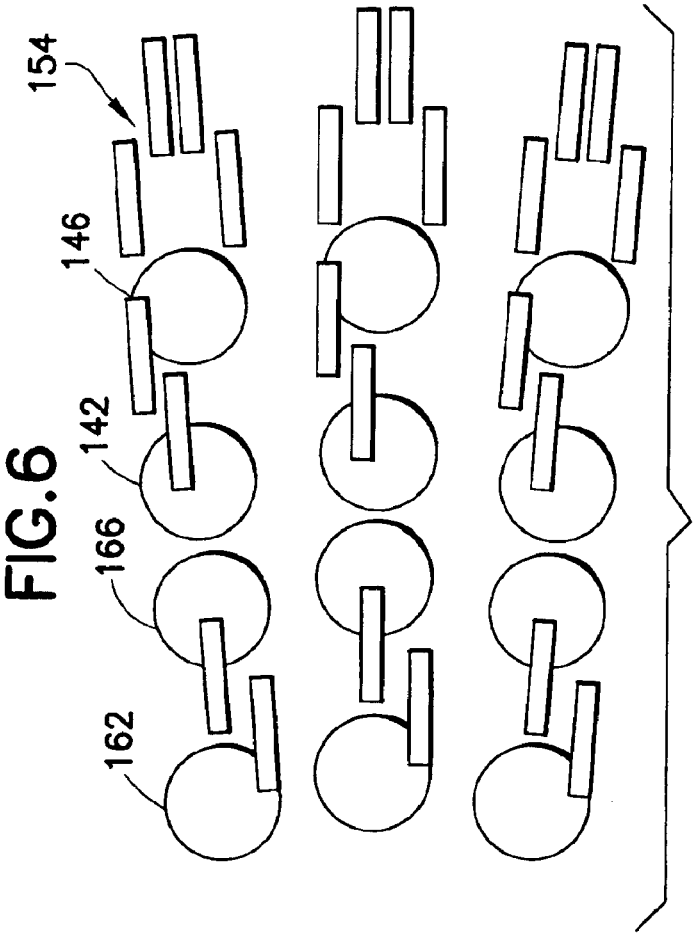
FIG. 7 shows a detail of an embodiment of the invention with non-parallel modules.

FIG. 7 shows an arrangement in which the modules are rotated with respect one another. This is less compact than the preferred perpendicular arrangement, in which the modules are perpendicular to the edge of the die, but it may be required if a manufacturer does not have packaging technology that is sufficiently dense. This arrangement also makes use of the finger overlap feature of the present invention in which two bond fingers overlap along a transverse axis perpendicular to the die edge, one extending inward from a first via and the other extending outward from a second via.

Table I shows a comparison between a conventional package layout having a pitch of 130 microns for signals and one according to the invention having a module pitch of 600 microns. Assumptions are: 80 micron bondfinger design width; 40 micron line width; 50 micron space; 350 micron land diameter; 500 micron min. via pitch; two signal layers.

TABLE I

|  | Conventional Design | Present Invention |
|---|---|---|
| Signal:Pwr Ratio | 3:1 | 6:2 |
| Signal Pitch | 3 @ 130 microns 420 microns |  |
| Via + Wiring Pitch |  | 600 microns |
| Resultant Substrate Pitch | 105 microns | 75 microns |

Looking ahead at improved ground rules, the data in Table II compare the same two arrangements with the following assumptions.

TABLE II

|  | Conventional Design | Present Invention |
|---|---|---|
| Signal:Pwr Ratio | 3:1 | 6:2 |
| Signal Pitch | 3 @ 105 microns 315 microns |  |
| Via + Wiring Pitch |  | 350 microns |
| Resultant Substrate Pitch | 78.7 microns | 43.7 microns |

While the invention has been described in terms of a single preferred embodiment, those skilled in the art will recognize that the invention can be practiced in various versions within the spirit and scope of the following claims.

What is claimed is:

1. An integrated circuit package, comprising:
an integrated circuit die; and
a set of circuit bond pads on the die connected to a set of package bond pads disposed on a first surface of the package, the package bond pads being arranged in a set of package bond pad modules such that at least one pair or individual package bond pads is disposed with a package bond pad module overlap in an overlap area along a transverse axis extending substantially perpendicular to the die, a first package bond pad of said being connected to a first via positioned inward of said overlap area and a second package bond pad of said pair being connected in a second via positioned outward of said overlap area, all of said first package bond pad, said first via, said second package bond pad and said second via being disposed within one of said package bond pad modules and forming a via submodule, each of said package bond pad modules having a package module pitch along a longitudinal axis parallel to a side of said integrated circuit die, wherein no connection for DC power passes along a conductive member that passes substantially parallel to a longitudinal axis substantially perpendicular to said transverse axis through substantially all of a subset of package bond pad modules on an edge of said die.

2. A package according to claim 1, in which at least one connector or DC power passes through a via submodule located along said transverse axis at a first position.

3. A package according to claim 2, which at least two connections for DC power pass through a single via submodule located at a first position along said transverse axis.

4. A package according to claim 3, in which at least two connections for DC power pass through corresponding first and second via submodules located at said first position along said transverse axis and in separate package bond pad modules.

5. A package according to claim 2, which no connection for DC power passes along a conductive member that passes substantially parallel to a longitudinal axis substantially perpendicular to said transverse axis through substantially all of a subset of package bond pad modules on an edge of said die.

* * * * *